(12) United States Patent
Uchida (10) Patent No.: US 7,842,530 B2
(45) Date of Patent: Nov. 30, 2010

(54) METHOD OF MANUFACTURING VERTICAL CAVITY SURFACE EMITTING LASER AND METHOD OF MANUFACTURING LASER ARRAY, VERTICAL CAVITY SURFACE EMITTING LASER AND LASER ARRAY, AND IMAGE FORMING APPARATUS WITH LASER ARRAY

(75) Inventor: Tatsuro Uchida, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 130 days.

(21) Appl. No.: 12/364,674

(22) Filed: Feb. 3, 2009

(65) Prior Publication Data
US 2009/0196318 A1 Aug. 6, 2009

(30) Foreign Application Priority Data
Feb. 6, 2008 (JP) ............................. 2008-026055

(51) Int. Cl.
*H01L 21/00* (2006.01)
(52) U.S. Cl. ............................. 438/39; 438/29; 257/466
(58) Field of Classification Search .................. 438/29, 438/39; 257/466
See application file for complete search history.

(56) References Cited

U.S. PATENT DOCUMENTS

| | | | | |
|---|---|---|---|---|
| 5,621,750 | A * | 4/1997 | Iwano et al. .................. 372/96 |
| 5,978,408 | A * | 11/1999 | Thornton ..................... 372/96 |
| 6,835,959 | B2 * | 12/2004 | Ouchi ......................... 257/79 |
| 7,180,101 | B2 * | 2/2007 | Ouchi ......................... 257/103 |
| 7,215,692 | B2 * | 5/2007 | Jewell ....................... 372/46.01 |
| 7,244,629 | B2 * | 7/2007 | Ezaki et al. .................... 438/39 |
| 7,295,745 | B2 | 11/2007 | Uchida ........................ 385/129 |
| 7,382,814 | B2 * | 6/2008 | Horie ...................... 372/50.12 |
| 7,408,967 | B2 * | 8/2008 | Collins et al. ............. 372/46.01 |
| 7,539,226 | B2 | 5/2009 | Uchida .................... 372/43.01 |
| 2003/0235226 | A1 | 12/2003 | Ueki ........................... 372/46 |
| 2007/0201527 | A1 | 8/2007 | Hori et al. ............... 372/50.124 |
| 2007/0205724 | A1 * | 9/2007 | Schaefer et al. ............. 313/633 |
| 2008/0205462 | A1 | 8/2008 | Uchida ........................ 372/34 |
| 2008/0304532 | A1 * | 12/2008 | Uchida .................. 372/50.124 |
| 2009/0010297 | A1 | 1/2009 | Uchida ................... 372/50.124 |
| 2009/0074026 | A1 | 3/2009 | Nagatomo et al. ...... 372/50.124 |
| 2009/0080489 | A1 | 3/2009 | Uchida et al. ........... 372/50.124 |
| 2009/0135872 | A1 | 5/2009 | Uchida et al. ............ 372/44.01 |
| 2009/0135876 | A1 | 5/2009 | Takeuchi et al. ......... 372/50.11 |
| 2009/0196319 | A1 | 8/2009 | Hori et al. ............... 372/50.124 |
| 2009/0231562 | A1 * | 9/2009 | Yoshii et al. ................... 355/53 |

* cited by examiner

FOREIGN PATENT DOCUMENTS

JP 2000-332355 A 11/2000

*Primary Examiner*—Matthew S Smith
*Assistant Examiner*—Nicholas Tobergte
(74) *Attorney, Agent, or Firm*—Fitzpatrick, Cella, Harper & Scinto

(57) ABSTRACT

A method of manufacturing a vertical cavity surface emitting laser of a mesa structure, the method comprises: sequentially laminating on a substrate a plurality of semiconductor layers including a bottom reflecting mirror, an active layer, a selective oxidation layer and a top reflecting mirror, followed by forming a dielectric film on the laminated semiconductor layers; forming on the dielectric film a first resist pattern comprised of large and small annular opening patterns and large and small annular resist patterns around the same central axis; forming the large and small annular opening patterns in the dielectric film; forming a second resist pattern in the dielectric film so that only the small annular opening pattern is exposed, followed by forming an annular electrode in the exposed small annular opening pattern; and forming a third resist pattern over the annular electrode.

10 Claims, 6 Drawing Sheets

METHOD OF MANUFACTURING VERTICAL CAVITY SURFACE EMITTING LASER AND METHOD OF MANUFACTURING LASER ARRAY, VERTICAL CAVITY SURFACE EMITTING LASER AND LASER ARRAY, AND IMAGE FORMING APPARATUS WITH LASER ARRAY

BACKGROUND OF THE INVENTION

1. Field of the Invention

The present invention relates to a method of manufacturing a vertical cavity surface emitting laser and a method of manufacturing a laser array, a vertical cavity surface emitting laser and a laser array, and an image forming apparatus with the laser array.

2. Description of the Related Art

A known configuration of a surface emitting laser is a vertical cavity surface emitting laser (VCSEL).

The surface emitting laser includes two reflectors sandwichingly holding an active region from respective sides, and a resonator formed perpendicularly to a substrate surface from which light is emitted in a vertical direction.

Each of the reflectors may be a distributed Bragg reflector (DBR) including a low refractive index layer and a high refractive index layer alternately laminated and each having an optical thickness of $\lambda/4$.

In addition to offering a stable single mode as a longitudinal mode property, the vertical cavity surface emitting laser has the excellent properties of allowing a reduction in threshold value and facilitating construction of a two-dimensional array compared to an end face emitting laser. The surface emitting laser is thus expected to be applicable as a light source for optical communication and transmission and for electrophotography.

For the vertical cavity surface emitting laser, controlling a transverse mode is an important challenge. In view of applications to communications, the transverse mode operation needs to be a single mode.

Thus, for the vertical cavity surface emitting laser, an attempt has been made to provide a single transverse mode by forming a current confinement structure inside an element by means of selective oxidation to limit an emitting region in the active layer, and at the same time, using the selectively oxidized portion to form a waveguide structure.

However, providing the single transverse mode using only the current confinement structure requires a reduction in confined diameter. The reduced confined diameter decreases the size of the emitting region. As a result, obtaining a high laser output power is difficult.

Thus, Japanese Patent Application Laid-Open No. 2000-332355 proposes a selectively oxidized vertical cavity surface emitting laser configured as follows.

An opening is formed in a top electrode formed on a top multilayer film reflector. The reflectance of a part of the multilayer film reflector which contacts the top electrode is lower than that of a part of the multilayer film reflector which is exposed in the opening.

This structure is intended to increase loss of a high-order transverse mode, in the region of the multilayer film reflector which contacts the top electrode so as to oscillate the single transverse mode based on the fundamental transverse mode.

That is, the vertical cavity surface emitting laser in Japanese Patent Application Laid-Open No. 2000-332355 is intended to control the transverse mode using the diameter of the current confinement structure and another parameter, the diameter of the opening in the top electrode, thus further stabilizing fundamental mode oscillation.

In the vertical cavity surface emitting laser in Japanese Patent Application Laid-Open No. 2000-332355, aligning a central axis of the opening in the top electrode with a central axis of a non-oxidized region of the current confinement structure is important.

Insufficient alignment between the central axes may inhibit oscillation of the fundamental transverse mode.

Thus, to solve this problem, U.S. Patent Application Publication No. 2003-0235226 proposes a method of manufacturing a surface emitting semiconductor laser as described below.

A dielectric and a metal contact layer are removed through a photo resist as a mask to form an annular etching mask formed of a metal contact layer or the like.

The inner diameter of the annular etching mask determines the diameter size of the opening in the electrode.

Then, a mesa structure is formed by RIE (Reactive Ion Etching) through the annular etching mask as a mask. A current confinement structure is provided by steam oxidation.

The diameter of the mesa structure is determined by the outer diameter of the annular etching mask. This also determines the diameter of the current confinement structure.

That is, in a photolithography stage, the inner and outer diameters of the metal contact layer are determined. The diameter of the opening in the electrode is defined by the inner diameter of the metal contact layer. The diameter of the current confinement structure is defined by the outer diameter of the metal contact layer.

With this configuration, owing to the high positional accuracy of the photolithography technique, the central axis of the electrode opening and the central axis of diameter of the current confinement structure are expected to be able to be controlled with a high positional accuracy.

SUMMARY OF THE INVENTION

According to the manufacturing method in U.S. Patent Application Publication No. 2003-0235226, when the oscillation of the single transverse mode is stabilized using the diameter of the current confinement structure and the another parameter, the diameter of the opening in the top electrode as in the case of Japanese Patent Application Laid-Open No. 2000-332355, the central axis of the electrode opening can be accurately aligned with the central axis of diameter of the current confinement structure.

However, when the mesa structure is formed according to the manufacturing method in U.S. Patent Application Publication No. 2003-0235226, etching is performed with a side surface of the metal contact layer exposed. The manufacturing method thus poses the following problems.

The problems will be described in further detail with reference to FIGS. 6A and 6B.

Figure 6A:
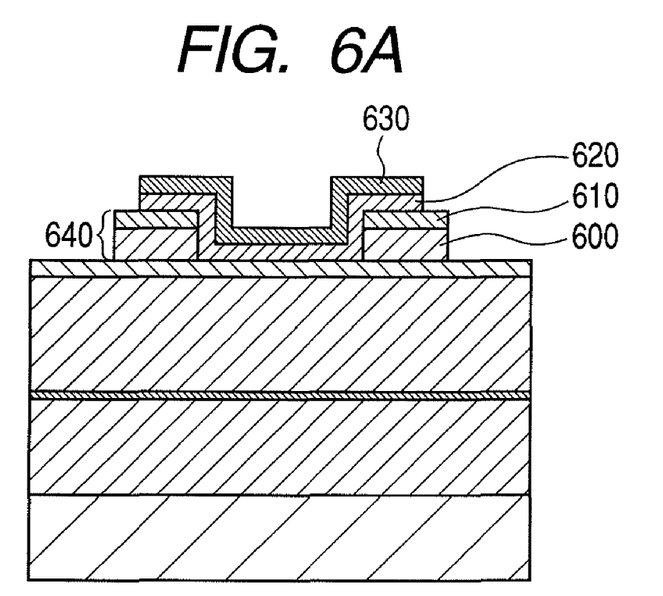
FIGS. 6A and 6B are schematic diagrams illustrating a method of manufacturing a surface emitting semiconductor laser described in U.S. Patent Application No. 2003/0235226, which is a conventional example.

FIG. 6A is a diagram illustrating the manufacturing method described in U.S. Patent Application Publication No. 2003-0235226. FIG. 6A schematically illustrates a condition observed before the formation of the mesa structure.

In the figure, an annular etching mask is formed of a metal contact layer 600 and SiON 610.

The inner diameter of the annular etching mask 640 has already defined the diameter of an opening in an electrode.

SiNx 620 and a resist 630 are formed on the annular etching mask 640.

Figure 6B:
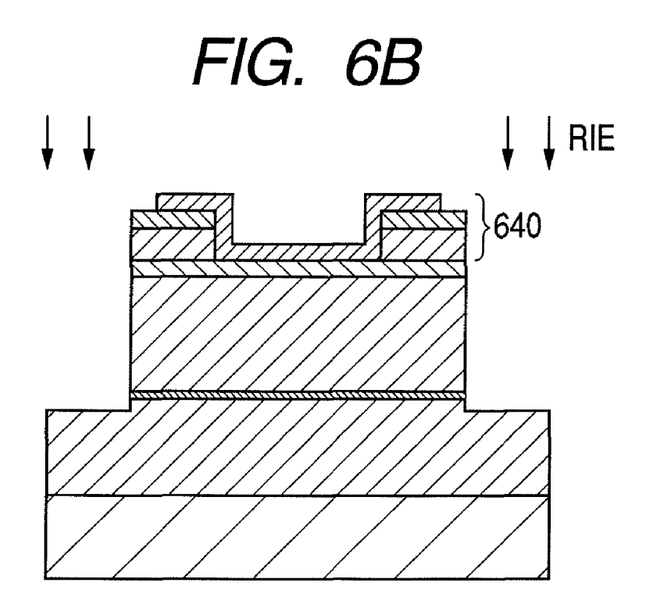

As illustrated in FIG. 6B, the mesa structure is produced by RIE through the annular etching mask 640 as a mask. At this time, the following problems occur.

With the manufacturing method, when the mesa structure is formed, etching is performed with a side surface of the metal contact layer 600 exposed.

With the side surface of the metal portion thus exposed, particles in plasma are not evenly distributed. Thus, providing a mesa structure of a uniform shape is difficult.

Furthermore, sputtering by the particles in the plasma causes the metal portion to fly off. The flying metal forms a micro mask, making provision of the mesa structure of the uniform shape is difficult.

Moreover, the metal flying off during etching may exert unfavorable effects at a pn junction. Thus, providing elements with high yield is also difficult.

In view of these problems, an object of the present invention is to provide a method of manufacturing a vertical cavity surface emitting laser which allows the electrode opening to align accurately with the current confinement structure and which allows the mesa structure of the uniform shape to be formed.

The present invention provides a method of manufacturing a vertical cavity surface emitting laser of a mesa structure, the method including: sequentially laminating, on a substrate, a plurality of semiconductor layers including a bottom reflecting mirror, an active layer, a selective oxidation layer and a top reflecting mirror, and forming a dielectric film on the laminated semiconductor layers; forming a large annular first resist pattern and a small annular first resist pattern on the dielectric film, the large annular first resist pattern being based on a large annular opening pattern, the small annular first resist pattern being based on a small annular opening pattern, the large and small annular first resist patterns having the same central axis; using the first resist pattern to form a large annular pattern and a small annular pattern on the dielectric film, the large and small annular patterns having the same central axis; forming a second resist pattern on the dielectric film with the large and small annular patterns formed thereon so that only the small annular opening pattern is exposed from the dielectric film, and forming an annular electrode in the opening in the exposed small annular opening pattern; and forming a third resist pattern over the annular electrode, and using the large annular opening pattern formed on the dielectric film and the third resist pattern to form the mesa structure.

The present invention can provide a method of manufacturing a vertical cavity surface emitting laser allowing the central axis of the electrode opening to align with the central axis of diameter of the current confinement structure and allowing the mesa structure of the uniform shape to be formed, the laser being capable of providing high power and achieving single transverse mode oscillation based on the fundamental mode.

The present invention is directed to a method of manufacturing a vertical cavity surface emitting laser of a mesa structure, the method comprising: sequentially laminating on a substrate a plurality of semiconductor layers including a bottom reflecting mirror, an active layer, a selective oxidation layer and a top reflecting mirror, followed by forming a dielectric film on the laminated semiconductor layers; forming on the dielectric film a first resist pattern comprised of large and small annular opening patterns which have the same central axis; forming the large and small annular opening patterns in the dielectric film, using the first resist pattern; forming a second resist pattern on the dielectric film with the large and small annular opening patterns so that only the small annular opening pattern is exposed, followed by forming an annular electrode in the exposed small annular opening pattern; and forming a third resist pattern over the annular electrode to form a mesa structure comprised of the large annular opening pattern formed in the dielectric film and the third resist pattern.

According to the present invention, the central axis of the electrode opening can be made the same as that of current confinement structure, and the mesa structure can be uniformly shaped. As a result, the present invention can provide a method of manufacturing a vertical cavity surface emitting laser which method suppresses the high-order transverse mode with the minimal loss of the fundamental transverse mode and allows an increase in the power of a fundamental transverse mode (high power single mode oscillation).

Further features of the present invention will become apparent from the following description of exemplary embodiments with reference to the attached drawings.

BRIEF DESCRIPTION OF THE DRAWINGS

FIGS. 4A, 4B and 4C are diagrams schematically illustrating a first resist pattern formed by the method of manufacturing the vertical cavity surface emitting laser according to Exemplary Embodiment 1 of the present invention wherein

DESCRIPTION OF THE EMBODIMENTS

Methods of manufacturing a vertical cavity surface emitting laser and a vertical cavity surface emitting laser array according to embodiments of the present invention will be described below; the methods suppress a high-order transverse mode with possible loss of a fundamental transverse mode inhibited to increase fundamental transverse mode power.

The vertical cavity surface emitting laser and vertical cavity surface emitting laser array according to the present embodiment are configured as described below in order to suppress the high-order transverse mode with possible loss of the fundamental transverse mode inhibited to increase the fundamental transverse mode power.

For the vertical cavity surface emitting laser and vertical cavity surface emitting laser array according to the present invention, in order to accurately align a central axis of an opening in a top electrode with a central axis of a non-oxidized region of a current confinement portion, a manufactured method is adopted which forms, at a time, a large annular pattern and a small annular pattern having the same central axis.

Specifically, the present invention adopts the manufacturing method of forming the large and small annular patterns which have the same central axis; the large annular pattern is based on a large annular opening pattern allowing the diameter of a mesa structure to be formed, the small annular pattern is based on a small annular opening pattern allowing the diameter of the opening in the annular electrode.

In this case, the mesa structure is formed by dry etching while the annular electrode formed at the small annular opening pattern is completely covered with resist.

The manufacturing method allows the mesa structure to be uniformly shaped, thus providing a vertical cavity surface emitting laser and a vertical cavity surface emitting laser array offering uniform properties.

Furthermore, the central axis of the mesa structure can be made the same as that of the annular electrode. The mesa structure can have a larger diameter than that of the annular electrode.

That is, the present exemplary embodiment avoids using an annular electrode as a mask as in the case of the conventional example, and forms the mesa structure by dry etching while the metal portion is completely covered with resist. Thus, a side surface of the mesa structure is not same an outer side surface of the annular electrode. As a result, the mesa structure can be uniformly shaped.

The above-described configuration allows the opening in the top electrode to align accurately with the non-oxidized region of the current confinement portion.

Thus, the reflectance of a part of the multilayer reflector which contacts the top electrode is set to be lower than that of a part of the multilayer reflector which is exposed in the opening in the top electrode, so as to increase the loss of the high-order transverse mode in the multilayer reflector which contacts the top electrode.

Moreover, in the vertical cavity surface emitting laser, the opening in the top electrode aligns accurately with the non-oxidized region of the current confinement portion. Thus, high-order mode oscillation can be sufficiently inhibited without suppressing fundamental mode oscillation.

Consequently, the present exemplary embodiment can provide a method of manufacturing a vertical cavity surface emitting laser which method suppresses the high-order transverse mode with the minimal loss of the fundamental transverse mode and allows an increase in the power of a fundamental transverse mode, and a method of manufacturing a vertical cavity surface emitting laser array with a plurality of the vertical cavity surface emitting laser arranged therein.

Furthermore, when including, as a light source, the vertical cavity surface emitting laser in which a plurality of the vertical cavity surface emitting lasers configured as described above according to the present exemplary embodiment is arranged, an image forming apparatus can achieve high-speed, high-definition printing.

EXEMPLARY EMBODIMENTS

Exemplary embodiments of the present invention will be described below.

Exemplary Embodiment 1

In Exemplary Embodiment 1, a method of manufacturing a vertical cavity surface emitting laser configured according to the present invention will be described.

Figure 1A:
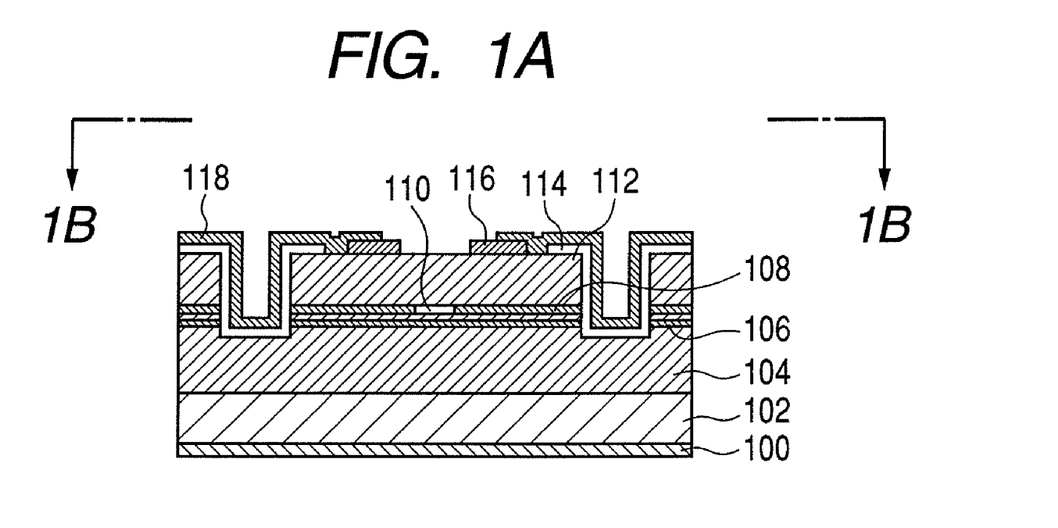
FIGS. 1A and 1B are schematic diagrams illustrating a vertical cavity surface emitting laser according to Exemplary Embodiment 1 of the present invention.
Figure 1B:
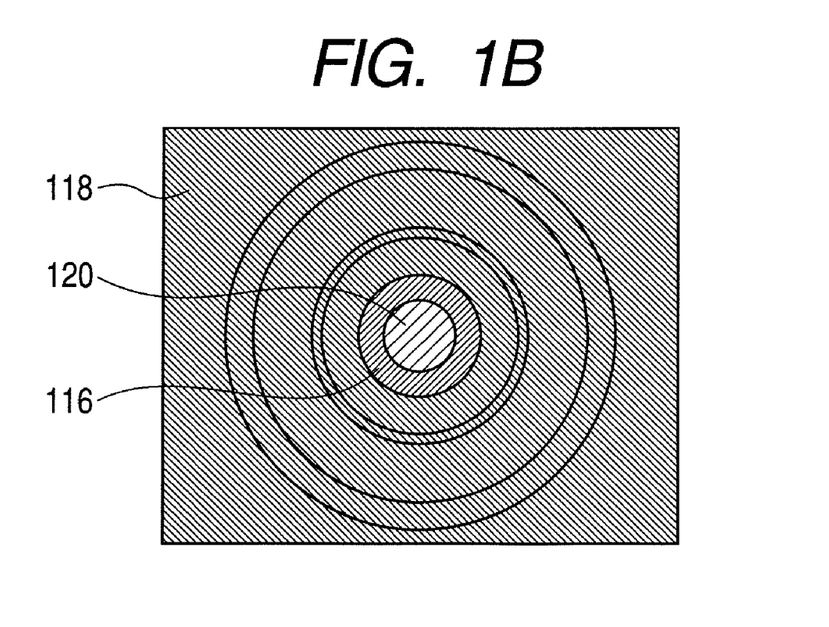

FIGS. 1A and 1B illustrate a vertical cavity surface emitting laser according to the present exemplary embodiment. FIG. 1A is a sectional view, and FIG. 1B is a plan view.

In FIGS. 1A and 1B, the vertical cavity surface emitting laser includes an n-side electrode 100, a substrate 102, a bottom DBR 104, an active layer 106, a current confinement portion (oxidized region) 108 and a non-oxidized region 110.

The vertical cavity surface emitting laser further includes a top DBR 112, an insulating film 114, a p-side electrode 116, a pad electrode 118 and an exit opening (top electrode opening) 120.

In the vertical cavity surface emitting laser according to the present exemplary embodiment, the central axis of the non-oxidized region and the center of the opening in the electrode (the center of the annular electrode) are accurately arranged.

In particular, if the diameter of the non-oxidized region is 3 to 5 microns, the vertical cavity surface emitting laser can provide high power and oscillate the single transverse mode when the electrode opening and the non-oxidized region are formed such that the diameter of the electrode opening is larger than that of the non-oxidized region by 0.5 to 1.0 micron.

Thus, by aligning the central axis of the non-oxidized region with the central axis of the electrode opening and setting an appropriate relationship between the diameter of the non-oxidized region and the diameter of the opening, emission of a high-order mode can be inhibited without loss of the fundamental mode.

Consequently, the vertical cavity surface emitting laser can provide high power and single transverse mode oscillation based on the fundamental mode.

Now, the method of manufacturing the vertical cavity surface emitting laser according to the present exemplary embodiment will be described. FIGS. 2A to 2J and 3K to 3Q are schematic diagrams illustrating the method of manufacturing the vertical cavity surface emitting laser according to the present exemplary embodiment. In FIGS. 2A to 2J, the vertical cavity surface emitting laser includes an n-type GaAs substrate 200, a bottom DBR mirror layer (a bottom reflecting mirror) 202, an active layer 204, a selective oxidation layer 206, a top DBR mirror layer (a top reflecting mirror) 208 and a dielectric film 210

Figure 2A:
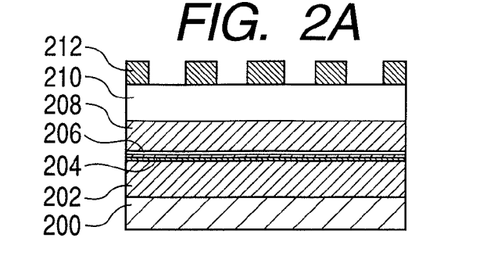
FIGS. 2A, 2B, 2C, 2D, 2E, 2F, 2G, 2H, 2I and 2J are schematic diagrams illustrating a method of manufacturing a vertical cavity surface emitting laser according to Exemplary Embodiment 1 of the present invention, the schematic diagrams illustrating a process of manufacturing the vertical cavity surface emitting laser.

The selective oxidation layer 206 allows the current confinement structure to be subsequently formed by selective oxidizing.

The vertical cavity surface emitting laser also includes a first resist pattern 212, a second resist pattern 214, a metal film (Ti/Au) 216, an annular electrode 218, a third resist pattern 220, an etching trench 222, an oxidized region 224 and a non-oxidized region 226.

Some layers such as a spacer layer and a contact layer are omitted in the figures.

In FIGS. 3K to 3Q, the vertical cavity surface emitting laser includes an insulating film (silicon oxide film) 300, a fourth resist pattern 302, a fifth resist pattern 304, a metal film (Ti/Au) 306, a pad electrode 308 and an n-side electrode (AuGe/Ni/Au) 310.

First, as illustrated in FIG. 2A, an MOCVD crystal growth technique is used to grow an n-type $Al_{0.9}Ga_{0.1}As/Al_{0.5}Ga_{0.5}As$-bottom DBR mirror layer 202 on an n-type GaAs substrate 200 via a buffer layer (not illustrated in the drawings). An n-type AlGaInP spacer layer and a GaInP/AlGaInP-MQW active layer 204 are sequentially grown on the n-type $Al_{0.9}Ga_{0.1}As/Al_{0.5}Ga_{0.5}As$-bottom DBR mirror layer 202.

Then, a p-type AlGaInP spacer layer, a p-type $Al_{0.98}Ga_{0.02}As$ layer 206, a p-type $Al_{0.9}Ga_{0.1}As/$ $Al_{0.5}Ga_{0.5}As$-top DBR mirror layer 208 and a p-type GaAs contact layer are sequentially grown on the active layer 204.

As above, the plurality of semiconductor layers including the bottom reflecting mirror, the active layer, the selective oxidation layer and the top reflecting mirror is sequentially laminated. A dielectric film is formed on the laminated semiconductor layers.

Specifically, a dielectric (silicon oxide) film 210 is deposited on the contact layer using a CVD film forming technique.

Subsequently, a first resist pattern 212 is formed on the dielectric film 210 using a photolithography technique.

A material for the dielectric film may be one of silicon oxide, silicon nitride and silicon oxynitride.

Figure 4A:
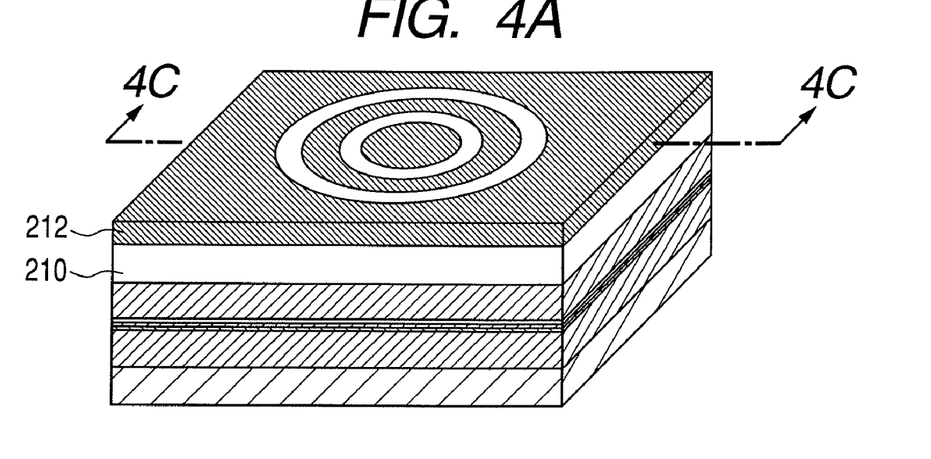
FIG. 4A is a perspective view.
Figure 4B:
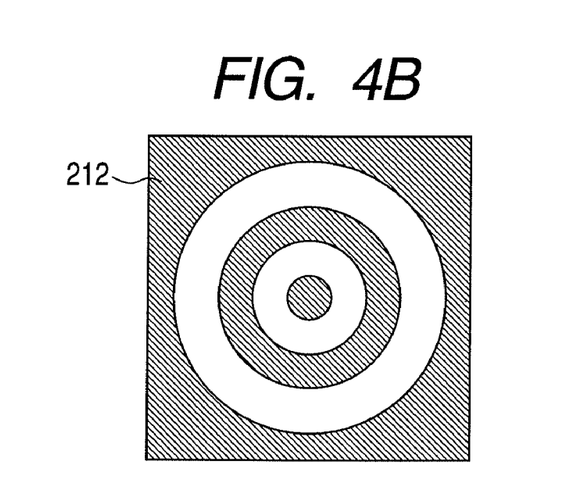
FIG. 4B is a plan view.
Figure 4C:
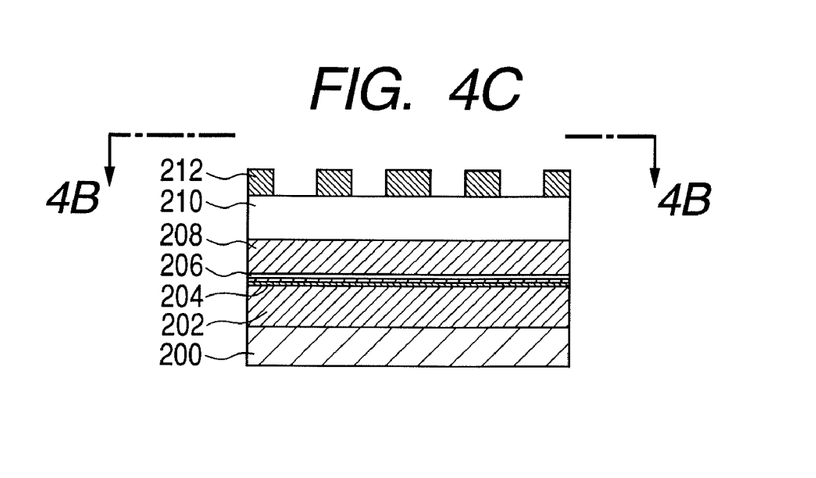
FIG. 4C is a sectional view taken along line 4C-4C in the perspective view.

FIGS. 4A, 4B and 4C are diagrams schematically illustrating the first resist pattern 212 formed as described above.

FIG. 4A is a perspective view. FIG. 4B is a plan view. FIG. 4C is a sectional view taken along line 4C-4C in the perspective view. As illustrated in FIGS. 4A, 4B and 4C, the first resist pattern 212 is formed such that two different annular patterns. A large annular pattern and a small annular pattern which have the same central axis are open on the dielectric film 210.

In the configuration illustrated in FIGS. 4A, 4B and 4C, the two different annular patterns, the large and small annular patterns, are composed of a large concentric annular pattern and a small concentric annular pattern which have different diameters. However, the present invention is not limited to this configuration. For example, the large and small annular patterns may be composed of a large concentric square annular pattern and a small concentric square annular pattern which are different in length of each side.

Figure 2B:
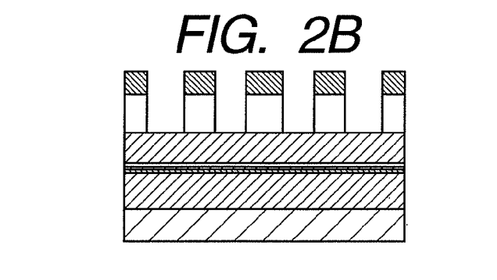

Then, as illustrated in FIG. 2B, the first resist pattern 212 is transferred to the dielectric film 210 by wet etching using a buffered hydrofluoric acid.

This transfer may be performed by dry etching instead of the wet etching.

At this time, the first resist pattern 212 is transferred so as to form two different annular opening patterns, a large annular opening pattern and a small annular opening pattern, which have the same central axis.

As described below, the small annular opening pattern defines the diameter of the opening in the top electrode. The large annular opening pattern defines the diameter of the mesa structure.

Figure 2C:
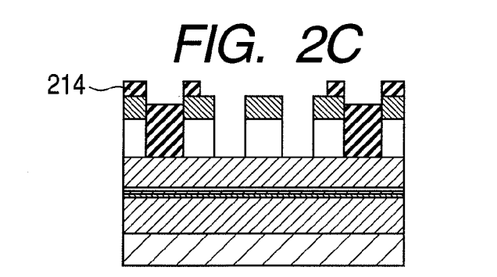

Then, as illustrated in FIG. 2C, the second resist pattern 214 is formed using the photolithography technique.

At this time, the second resist pattern 214 is formed so as to expose only the small annular opening pattern.

Figure 2D:
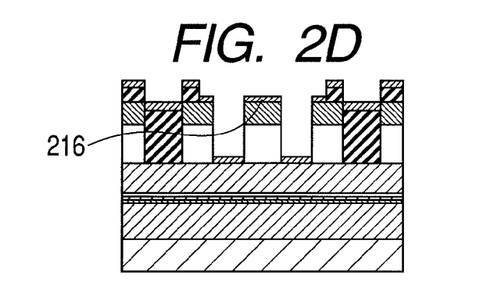

Then, as illustrated in FIG. 2D, the metal film (Ti/Au) 216 is deposited on the resulting surface using a metal evaporation technique.

Figure 2E:
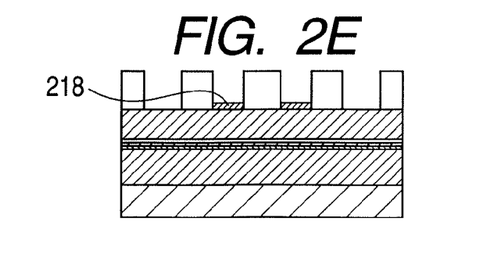

Then, as illustrated in FIG. 2E, the annular electrode (p-side electrode) 218 is formed by a liftoff technique using the second resist pattern.

At this time, the first resist pattern 212 and the second resist pattern 214 formed during the previous steps are removed.

Figure 2F:
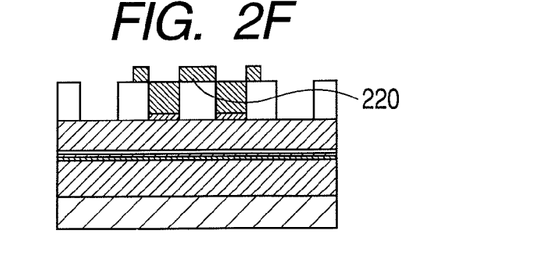

Then, as illustrated in FIG. 2F, the third resist pattern 220 is formed using the photolithography technique. At this time, the third resist pattern 220 is formed so as to completely cover the electrode 218.

Figure 2G:
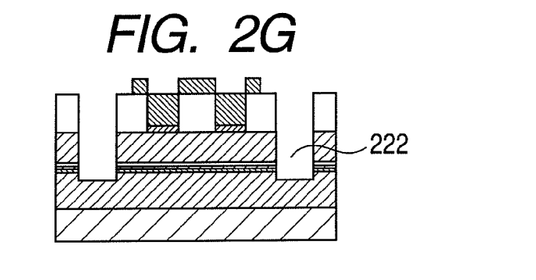

Then, as illustrated in FIG. 2G, the dry etching technique is used to form the etching trench 222 so as to expose the n-type $Al_{0.9}Ga_{0.1}As/Al_{0.5}Ga_{0.5}As$-bottom DBR mirror layer 202.

Figure 2H:
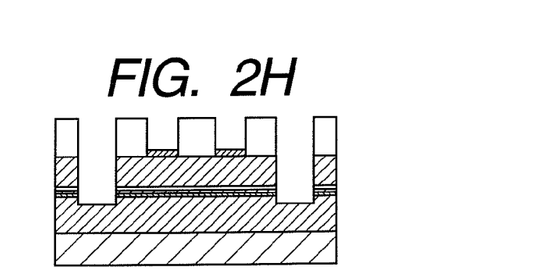

Then, as illustrated in FIG. 2H, an oxygen plasma ashing technique is used to remove the third resist pattern 220.

Figure 2I:
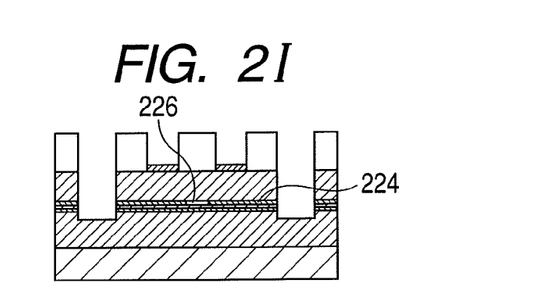

Then, as illustrated in FIG. 2I, the p-type $Al_{0.98}Ga_{0.02}As$ layer 206 is selectively oxidized at a substrate temperature of 450° C. and in a vapor atmosphere to form the current confinement structure (oxidized region 224 and non-oxidized region 226).

Figure 2J:
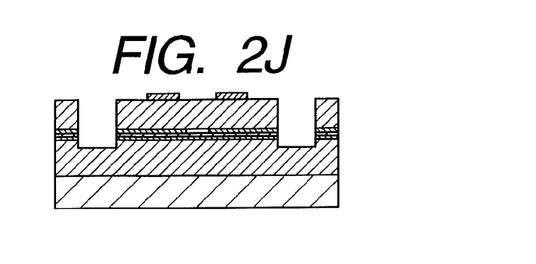

Then, as illustrated in FIG. 2J, the dielectric film 210 is removed by wet etching using a buffered hydrofluoric acid.

Figure 3K:
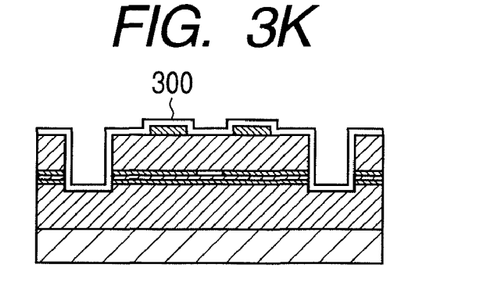
FIGS. 3K, 3L, 3M, 3N, 3O, 3P and 3Q are schematic diagrams illustrating the method of manufacturing the vertical cavity surface emitting laser according to Exemplary Embodiment 1 of the present invention, the schematic diagrams illustrating process steps continued from a step illustrated in FIG. 2J (FIGS. 3A to 3J are not present).

Then, as illustrated in FIG. 3K, the insulating silicon oxide film 300 is deposited all over the resulting surface using a CVD film forming technique.

Figure 3L:
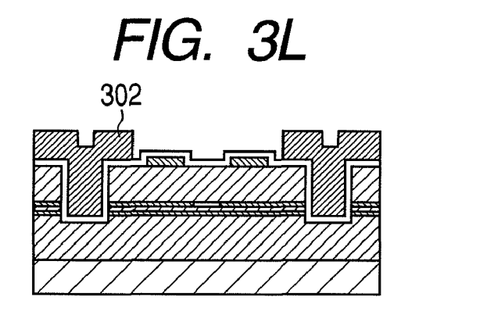

Then, as illustrated in FIG. 3L, the photolithography technique is used to form the fourth resist pattern 302.

Figure 3M:
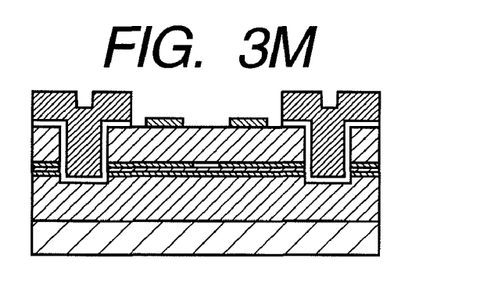

Then, as illustrated in FIG. 3M, the annular electrode and the exit opening are exposed by wet etching using a buffered hydrofluoric acid. Thereafter, the fourth resist pattern is removed (not illustrated in the drawings).

Figure 3N:
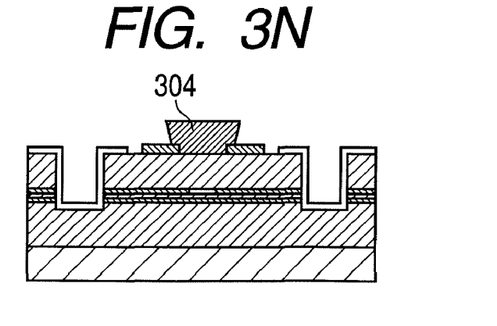

Then, as illustrated in FIG. 3N, the fifth resist pattern 304 is formed using the photolithography technique.

At this time, the fifth resist pattern 304 is formed so as to block the exit opening. A resist pattern is formed so as to electrically separate devices from each other (not illustrated in the drawings).

Figure 3O:
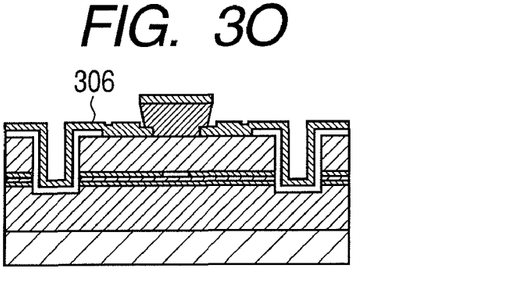

Then, as illustrated in FIG. 3O, the metal film (Ti/Au) 306 is deposited on the resulting surface using the metal evaporation technique.

Figure 3P:
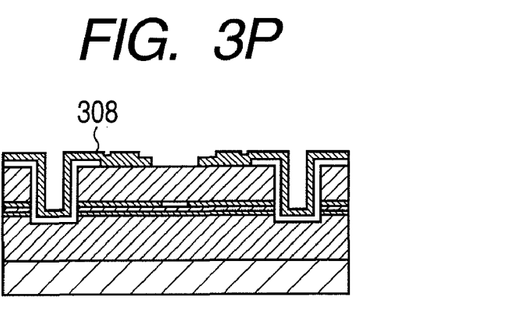

Then, as illustrated in FIG. 3P, the pad electrode 308 is formed by the liftoff technique so as to connect electrically to the annular electrode.

Figure 3Q:
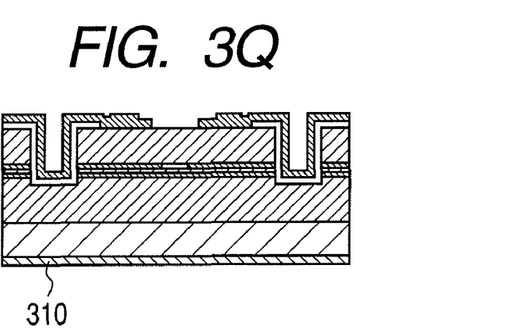

Then, as illustrated in FIG. 3Q, the n-side electrode (AuGe/Ni/Au) 310 is formed on a back surface of the n-type GaAs substrate using the metal evaporation technique.

In the present exemplary embodiment, the exit opening is designed to be a circle with a diameter of 5.5 μm. An oxidation confinement diameter is designed to be 5.0 μm.

According to the above-described steps, the two different annular opening patterns, the large and small annular opening patterns, are formed using the positionally accurate photolithography technique.

The small annular opening pattern defines the diameter of the opening in the top electrode. The large annular opening pattern defines the diameter of the mesa structure and the diameter of the current confinement structure.

Consequently, the central axis of the electrode opening and the central axis of diameter of the current confinement structure can be positionally accurately controlled.

Furthermore, when the mesa structure is produced using the large annular opening pattern, the metal portion formed in the small annular opening pattern is prevented from being exposed. This eliminates disadvantages resulting from the exposure of the metal portion during etching, allowing the central axis of the electrode opening and the central axis of diameter of the current confinement structure to be positionally accurately controlled.

As a result, a vertical cavity surface emitting laser can be provided which allows the fundamental transverse mode oscillation and high power (high power single mode oscillation).

In the present exemplary embodiment, the 680-nm band vertical cavity surface emitting laser has been described. However, the present invention is not limited to this aspect but is applicable to, for example, an 850-nm band (GaAs/AlGaAs active layer) vertical cavity surface emitting laser.

Furthermore, techniques (apparatuses) used for the growth, photolithography, etching, ashing, and evaporation are not limited to those illustrated in the present exemplary embodiment. Any techniques (apparatuses) may be used provided that the techniques (apparatuses) can exert similar effects.

Additionally, in the present exemplary embodiment, the method of manufacturing the vertical cavity surface emitting laser made up of the single element has been described. However, the above-described manufacturing method is applicable to an array of a plurality of the vertical cavity surface emitting lasers made up of the single element.

Consequently, the present invention can provide a vertical cavity surface emitting laser array with a plurality of vertical cavity surface emitting lasers offering uniform characteristics.

In particular, a manufacturing method of performing dry etching with the metal portion (top electrode) completely covered according to the present invention is applicable to a small-pitch (equal to or smaller than 50 μm) array having a short distance between the vertical cavity surface emitting lasers.

Thus, the vertical cavity surface emitting lasers on the array can be uniformly manufactured, and a vertical cavity surface emitting laser array can be provided in which the vertical cavity surface emitting lasers have uniform characteristics.

Exemplary Embodiment 2

In Exemplary Embodiment 2, an example will be described in which an image forming apparatus is formed as a form of applied example of the vertical cavity surface emitting laser array according to the present invention.

Figure 5A:
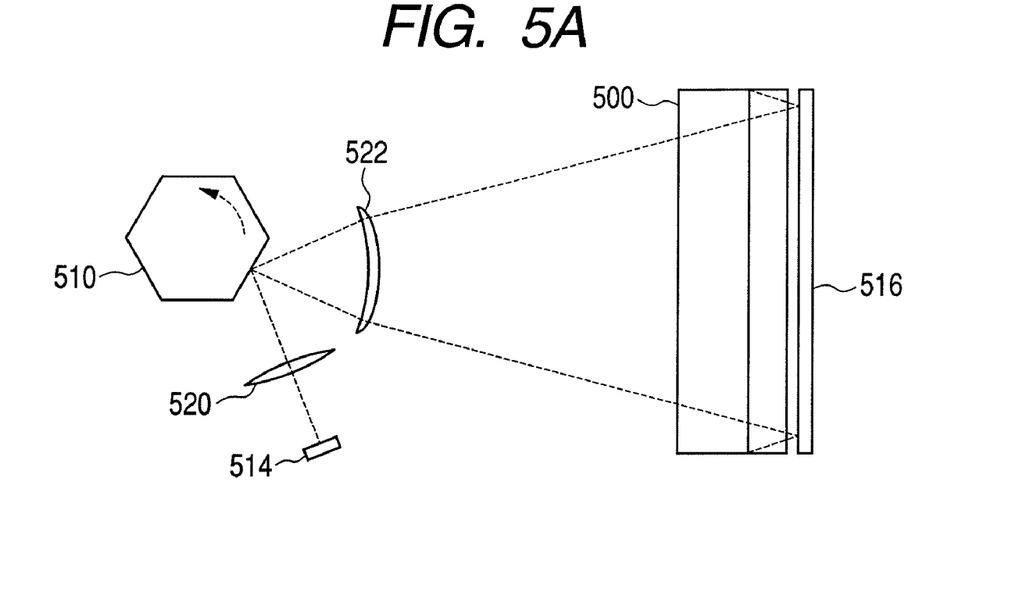
FIGS. 5A and 5B are schematic diagrams illustrating an image forming apparatus based on an electrophotographic recording scheme in which a vertical cavity surface emitting laser array according to Exemplary Embodiment 2 of the present invention is mounted.
Figure 5B:
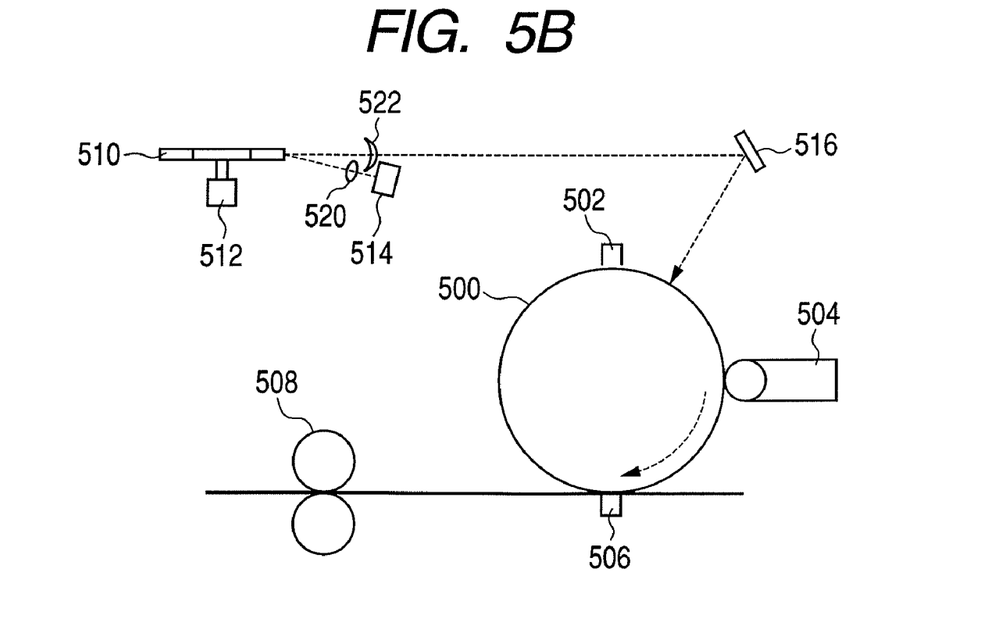

FIGS. 5A and 5B are diagrams illustrating the structure of the image forming apparatus based on an electrophotographic recording scheme and in which the vertical cavity surface emitting laser array according to the present invention is mounted.

FIG. 5A is a plan view of the image forming apparatus. FIG. 5B is a side view of the image forming apparatus.

In FIGS. 5A and 5B, the image forming apparatus includes a photosensitive drum 500, a charger 502, a developing unit 504, a transfer charger 506, a fixing unit 508, a rotatable polygon mirror 510 and a motor 512.

The image forming apparatus further includes a vertical cavity surface emitting laser array 514, a reflector 516, a collimator lens 520 and an f-θ lens 522.

In FIGS. 5A and 5B, the motor 512 rotationally drives the rotatable polygon mirror 510.

The rotatable polygon mirror 510 according to the present exemplary embodiment has six reflecting surfaces.

The vertical cavity surface emitting laser array 514 serves as a recording light source and is configured to be turned on and off by operation of a laser driver (not illustrated in the drawings) in accordance with image signals.

The optically modulated laser light is emitted from the vertical cavity surface emitting laser array 514 toward the rotatable polygon mirror 510 through the collimator lens 520.

The rotatable polygon mirror 510 rotates in the direction indicated by the arrow in FIG. 5A. The laser beam from the vertical cavity surface emitting laser array 514 is incident on the reflecting surfaces of the rotatable polygon mirror 510 and reflected as deflected beams during the rotatable polygon mirror 510

The reflected beam undergoes distortion correction or the like by the f-θ lens 522 and is incident on the photosensitive drum 500 via the reflecting mirror 516 to scan the photosensitive drum 500 in the main scanning direction. At this time, by the reflection of the beam from one reflecting surface of the rotatable polygon mirror 510, an image representing a plurality of lines corresponding to the vertical cavity surface emitting laser array 514 is formed in the main scanning direction of the photosensitive drum 500.

The present exemplary embodiment uses the 4×8 vertical cavity surface emitting laser array 514 to form an image for thirty two lines.

The photosensitive drum 500 is pre-charged by the charger 502 and sequentially exposed by scanning laser beam to form an electrostatic latent image.

The photosensitive drum 500 rotates in the direction indicated by an arrow in FIG. 5B. The electrostatic latent image is developed by the developing unit 504. The developed visible image is transferred onto transfer paper (not illustrated in the drawings) by the transfer charger 506.

Then, the transfer paper with the transferred visible image is conveyed to the fixing unit 508 to be fixed and is then ejected from the image forming apparatus.

A beam detect sensor (hereinafter referred to as a BD sensor; not illustrated in the drawings) is disposed at a side portion of the photosensitive drum 500 near a scanning start position in the main scanning direction.

The laser beam reflected by each reflecting surface of the rotatable polygon mirror 510 is detected by the BD sensor prior to line scanning.

A signal detected by BD sensor is input to a timing controller (not illustrated in the drawings) as a scan start reference signal in the main scanning direction. This detected signal is used as the reference for synchronization of a writing start position of each line in the main scanning direction.

In this exemplary embodiment, a 4×8 vertical cavity surface emitting laser array is used, any m×n (m, n: natural number (not including 0)) vertical cavity surface emitting laser array can be employed.

As described above, by vertical cavity surface emitting laser array according to an exemplary embodiment of the present invention to an image forming apparatus implementing an electrophotographic recording system, an image forming apparatus capable of high-speed, high-definition printing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-026055, filed Feb. 6 2008, which is hereby incorporated by reference herein in its entirety.

What is claimed is:

1. A method of manufacturing a vertical cavity surface emitting laser of a mesa structure, the method comprising:
   sequentially laminating on a substrate a plurality of semiconductor layers including a bottom reflecting mirror, an active layer, a selective oxidation layer and a top reflecting mirror, followed by forming a dielectric film on the laminated semiconductor layers;
   forming on the dielectric film a first resist pattern comprised of large and small annular opening patterns having the same central axis;
   forming the large and small annular opening patterns in the dielectric film, using the first resist pattern;
   forming a second resist pattern on the dielectric film with the large and small annular opening patterns so that only the small annular opening pattern is exposed, followed by forming an annular electrode in the exposed small annular opening pattern; and
   forming a third resist pattern over the annular electrode to form a mesa structure comprised of the large annular opening pattern formed in the dielectric film and the third resist pattern.

2. The method of manufacturing the vertical cavity surface emitting laser according to claim 1, wherein a material for the dielectric film is comprised of one selected from the group consisting of silicon oxide, silicon nitride, and silicon oxynitride.

3. The method of manufacturing the vertical cavity surface emitting laser according to claim 1, wherein the large and small annular opening patterns are a large concentric annular pattern and a small concentric annular pattern which have different diameters.

4. The method of manufacturing the vertical cavity surface emitting laser according to claim 1, wherein the large and small annular opening patterns are a large concentric square annular pattern and a small concentric square annular pattern which are different in length of each side.

5. The method of manufacturing the vertical cavity surface emitting laser according to claim 1, wherein the first resist pattern is formed by dry etching or wet etching.

6. The method of manufacturing the vertical cavity surface emitting laser according to claim 1, wherein the annular electrode is formed by a liftoff technique using the second resist pattern.

7. The method of manufacturing the vertical cavity surface emitting laser according to claim 6, wherein when the annular electrode is formed by the liftoff technique, the first resist pattern and the second resist pattern are removed.

8. The method of manufacturing the vertical cavity surface emitting laser according to claim 1, wherein when the first resist pattern is formed, the large annular opening pattern is formed by the dry etching.

9. A method of manufacturing a vertical cavity surface emitting laser array by arranging a plurality of vertical cavity surface emitting lasers obtained by the method of manufacturing the vertical cavity surface emitting laser according to claim 1.

10. A method of manufacturing a surface emitting laser, the method comprising:
  forming a semiconductor layer having a mirror, an active layer, and a selective oxidation layer, on a substrate;
  forming a dielectric film on the semiconductor layer;
  forming a first opening pattern and a second opening pattern having a smaller opening size than the first opening pattern and having a central axis aligning with a central axis of the first opening pattern on the dielectric film;
  forming a resist pattern A on the first opening pattern while keeping the second opening pattern exposed;
  forming an electrode on the second opening pattern;
  forming a resist pattern B on the electrode; and
  performing etching using the resist pattern B and the first opening pattern to form a mesa structure.

* * * * *